(12) United States Patent
Gondhalekar et al.

(10) Patent No.: US 7,722,737 B2
(45) Date of Patent: May 25, 2010

(54) GAS DISTRIBUTION SYSTEM FOR IMPROVED TRANSIENT PHASE DEPOSITION

(75) Inventors: Sudhir Gondhalekar, Fremont, CA (US); Robert Duncan, San Jose, CA (US); Siamak Salimian, Sunnyvale, CA (US); Muhammad M. Rasheed, Fremont, CA (US); Harry Smith Whitesell, San Jose, CA (US); Bruno Geoffrion, San Jose, CA (US); Padmanabhan Krishnaraj, San Francisco, CA (US); Rudolf Gujer, Saratoga, CA (US); Diana E. Gujer, legal representative, Henderson, NV (US)

(73) Assignee: Applied Materials, Inc., Santa Clara, CA (US)

( * ) Notice: Subject to any disclaimer, the term of this patent is extended or adjusted under 35 U.S.C. 154(b) by 484 days.

(21) Appl. No.: 11/123,453

(22) Filed: May 4, 2005

(65) Prior Publication Data

US 2006/0113038 A1    Jun. 1, 2006

Related U.S. Application Data

(60) Provisional application No. 60/631,714, filed on Nov. 29, 2004.

(51) Int. Cl.
*H01L 21/326* (2006.01)
*C23C 16/505* (2006.01)
(52) U.S. Cl. .......................... 156/345.33; 156/345.34; 118/715
(58) Field of Classification Search ................. 118/715; 156/345.33, 345.34
See application file for complete search history.

(56) References Cited

U.S. PATENT DOCUMENTS 5,156,820 A * 10/1992 Wong et al. ............. 422/186.05
5,620,523 A *  4/1997 Maeda et al. ............ 118/723 IR (Continued)

OTHER PUBLICATIONS

US Non-Final Office Action for U.S. Appl. No. 11/877,502, dated on Aug. 29, 2008, pp. 8.

(Continued)

*Primary Examiner*—Parviz Hassanzadeh
*Assistant Examiner*—Satish Chandra
(74) *Attorney, Agent, or Firm*—Townsend and Townsend and Crew

(57) ABSTRACT

Embodiments of the present invention are directed to a gas distribution system which distributes the gas more uniformly into a process chamber. In one embodiment, a gas distribution system comprises a gas ring including an outer surface and an inner surface, and a gas inlet disposed at the outer surface of the gas ring. The gas inlet is fluidicly coupled with a first channel which is disposed between the outer surface and the inner surface of the gas ring. A plurality of gas outlets are distributed over the inner surface of the gas ring, and are fluidicly coupled with a second channel which is disposed between the outer surface and the inner surface of the gas ring. A plurality of orifices are fluidicly coupled between the first channel and the second channel. The plurality of orifices are spaced from the gas inlet by a plurality of distances, and have sizes which vary with the distances from the gas inlet as measured along the first channel, such that the size of the orifice increases with an increase in the distance between the orifice and the gas inlet as measured along the first channel.

10 Claims, 4 Drawing Sheets

U.S. PATENT DOCUMENTS

| | | |
|---|---|---|
| 5,772,771 A | 6/1998 | Li et al. |
| 6,015,591 A | 1/2000 | Li et al. |
| 6,217,658 B1 | 4/2001 | Orcyzek et al. |
| 6,372,291 B1 | 4/2002 | Hua et al. |
| 6,383,954 B1 * | 5/2002 | Wang et al. ............... 438/789 |
| 6,436,193 B1 * | 8/2002 | Kasai et al. ............... 118/715 |
| 6,458,722 B1 | 10/2002 | Kapoor et al. |
| 6,486,081 B1 | 11/2002 | Ishikawa et al. |
| 6,641,673 B2 * | 11/2003 | Yang ..................... 118/723 R |
| 6,896,737 B1 | 5/2005 | Sandhu |
| 7,141,145 B2 | 11/2006 | Brucker et al. |
| 7,252,716 B2 * | 8/2007 | Kim et al. ............... 118/715 |
| 7,303,141 B2 * | 12/2007 | Han et al. ..................... 239/1 |
| 2002/0076939 A1 * | 6/2002 | Li et al. ....................... 438/767 |
| 2003/0213562 A1 * | 11/2003 | Gondhalekar et al. .. 156/345.48 |
| 2004/0020433 A1 * | 2/2004 | Su ........................ 118/723 R |
| 2004/0099216 A1 * | 5/2004 | Koh et al. ............. 118/723 CB |
| 2004/0099378 A1 * | 5/2004 | Kim et al. ............. 156/345.33 |
| 2004/0231798 A1 | 11/2004 | Gondhalekar et al. |
| 2005/0072664 A1 | 4/2005 | Brucker et al. |

OTHER PUBLICATIONS

Final Office Action for U.S. Appl. No. 11/877,502, dated on Mar. 9, 2009, pp. 11.

Advisory Action for U.S. Appl. No. 11/877,502 mailed on May 27, 2009; 4 pages.

* cited by examiner

GAS DISTRIBUTION SYSTEM FOR IMPROVED TRANSIENT PHASE DEPOSITION

CROSS-REFERENCES TO RELATED APPLICATIONS

This application claims the benefit of U.S. Provisional Patent Application No. 60/631,714, filed Nov. 29, 2004, the entire disclosure of which is incorporated herein by reference.

BACKGROUND OF THE INVENTION

This invention relates generally to semiconductor processing and, more particularly, to an improved gas distribution system, for instance, for a chemical vapor deposition chamber to provide improved transient phase deposition.

One of the primary steps in the fabrication of modem semiconductor devices is the formation of a thin layer on a semiconductor substrate by chemical reaction of gases. Such a deposition process is referred to generally as chemical-vapor deposition ("CVD"). Conventional thermal CVD processes supply reactive gases to the substrate surface where heat-induced chemical reactions take place to produce a desired layer. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive. "High-density" is understood in this context to mean having an ion density that is equal to or exceeds $10^{11}$ ions/cm$^3$.

Particular applications that lend themselves to effective use of HDP-CVD techniques include shallow-trench isolation ("STI"), premetal dielectric ("PMD") applications, and intermetal dielectric ("IMD") applications. One issue that affects deposition properties in various such applications is diffusion between adjoining layers that have different compositions, which can adversely affect certain desired properties of the resulting layer structure. One approach that has been used to prevent such diffusion includes deposition of an additional intermediate barrier layer. For example, when doped silicon oxide is deposited in IMD applications, diffusion of the dopant to metal lines may cause the formation of undesirable chemical species at the oxide/metal interface, resulting in poor adhesion between the oxide and the metal. Deposition of a silicon-rich liner on the metal prior to depositing the doped silicon oxide layer acts to prevent dopant diffusion. Including the barrier layer has the beneficial effect of improving adhesion in the structure. It is almost routine now in many applications to deposit barrier layers when forming certain structures. For example, a silicon-rich oxide liner is commonly formed on a substrate prior to deposition of a layer of fluorine-doped silicon oxide in fluorosilicate-glass ("FSG") applications using HDP-CVD.

The deposition of an initial deposition layer or liner is a key component in preventing plasma damage in HDP-CVD reactors. There is substantial difficulty in achieving a uniform liner due to the nonuniform gas distribution in the transient phase of initial deposition. One current approach to deposit a uniform liner employs a low pressure strike which involves gas mixing in the chamber without plasma. During the mixing step, the substrate is cooling without the plasma, thereby lowering the deposition temperature of the liner. The liner precursor gases typically may include oxygen and a silicon-source gas such as silane, and perhaps also a fluorine-containing gas such as SiF$_4$. Striking of the plasma after the premixing step may proceed by a low-pressure strike such as described in the copending, commonly assigned U.S. patent application Ser. No. 09/470,819, filed Dec. 23, 1999, entitled "LOW PRESSURE STRIKE IN HDP-CVD CHAMBER." Use of low pressure strike also avoids plasma instability during the plasma stage ignition period, which might otherwise contribute to inconsistent film quality.

On the other hand, maximizing the deposition temperature has been demonstrated to be a key gapfill component in a HDP-CVD reactor. By lowering the deposition temperature using low pressure strike, the gapfill characteristics will tend to suffer.

BRIEF SUMMARY OF THE INVENTION

Embodiments of the present invention are directed to a gas distribution system which distributes the gas more uniformly into a process chamber during a transient phase when the gas initially flows via the gas distribution system into a process chamber. In specific embodiments, the gas distribution system incorporates variable orifice sizes between an outer channel and an inner channel. The gas flows via a gas inlet into the outer channel, and then travels through the orifices having different sizes into the inner channel. The size of an orifice increases with a distance between the orifice and the gas inlet as measured along the outer channel. In this way, the gas flow is distributed more evenly into the inner gas channel which is fluidically coupled to a plurality of gas outlets disposed around the chamber to introduce the gas into the chamber. The outer and inner channels are configured in a circular gas ring around the process chamber. The gas distribution system may be used to deposit a uniform liner without lowering initial deposition temperature as is done in a low pressure strike approach, thereby ensuring quality of the deposition, including good gapfill characteristics.

In accordance with an aspect of the present invention, a gas distribution system comprises a gas ring including an outer surface and an inner surface, and a gas inlet disposed at the outer surface of the gas ring. The gas inlet is fluidically coupled with a first channel which is disposed between the outer surface and the inner surface of the gas ring. A plurality of gas outlets are distributed over the inner surface of the gas ring, and are fluidically coupled with a second channel which is disposed between the outer surface and the inner surface of the gas ring. A plurality of orifices are fluidicly coupled between the first channel and the second channel. The plurality of orifices are spaced from the gas inlet by a plurality of distances, and have sizes which vary with the distances from the gas inlet as measured along the first channel, such that the size of the orifice increases with an increase in the distance between the orifice and the gas inlet as measured along the first channel.

In accordance with another aspect of the invention, a method of distributing a gas flowing into a chamber for processing a substrate comprises providing a gas ring including an outer surface and an inner surface, a first channel disposed between the outer surface and the inner surface, and a second channel disposed between the outer surface and the inner surface. The first channel is fluidically coupled with the second channel via a plurality of orifices. A gas is introduced into the gas ring via a gas inlet disposed at the outer surface of the gas ring. The gas flows via the gas inlet into the first channel through the plurality of orifices into the second channel and through a plurality of gas outlets which are fluidicly coupled with the second channel, and into the chamber. The plurality of orifices are spaced from the gas inlet by a plurality of distances. The orifices have different sizes to provide a substantially uniform distribution of the gas into the chamber via the gas outlets during a transient period when the gas is initially introduced into the gas ring.

DETAILED DESCRIPTION OF THE INVENTION

Figure 1:
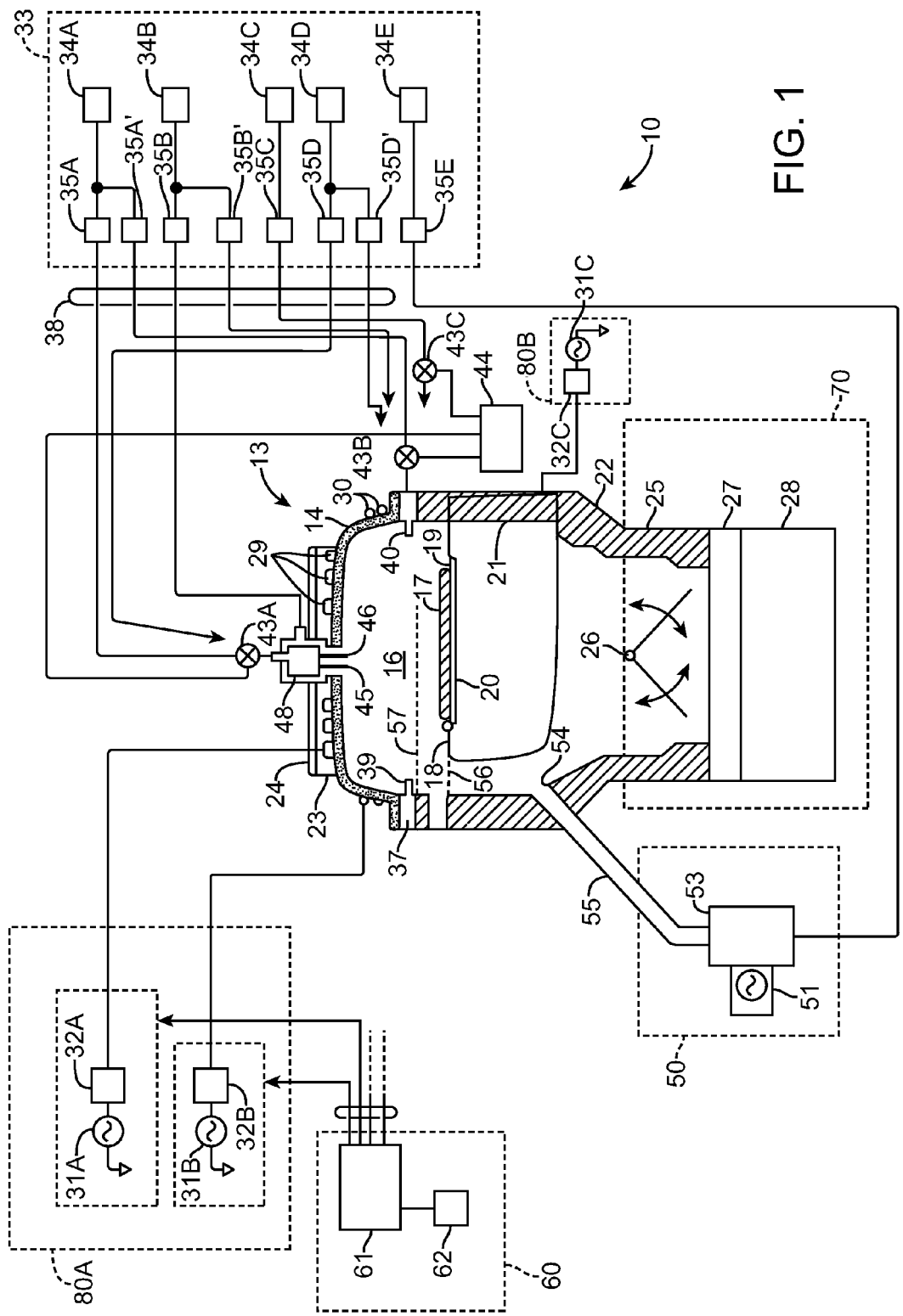
FIG. 1 is a simplified diagram of an embodiment of a high density plasma chemical vapor deposition (HDP-CVD) system according to the present invention.

FIG. 1 illustrates one embodiment of a high density plasma chemical vapor deposition (HDP-CVD) system 10 in which a dielectric layer can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

Generally, exposure to the plasma heats a substrate positioned on substrate support 18. Substrate support 18 includes inner and outer passages (not shown) that can deliver a heat transfer gas (sometimes referred to as a backside cooling gas) to the backside of the substrate.

The lower portion of chamber 13 includes a body member 22, which joins the chamber to the vacuum system. A base portion 21 of substrate support 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 includes an electrostatic chuck 20 that secures the substrate to substrate support 18 during substrate processing. In a preferred embodiment, substrate support 18 is made from an aluminum oxide or aluminum ceramic material.

Vacuum system 70 includes throttle body 25, which houses three-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 milli-Torr to about 2 Torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to about 8,000 watts (7 kW) of RF power or higher at nominally 2 MHz and the side source RF generator 31B provides up to 8,000 watts (5 kW) of RF power or higher at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 8,000 watts of RF power or higher at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition. Other measures may also help stabilize a plasma. For example, the RF control circuit can be used to determine the power delivered to the load (plasma) and may increase or decrease the generator output power to keep the delivered power substantially constant during deposition of a layer.

Figure 2:
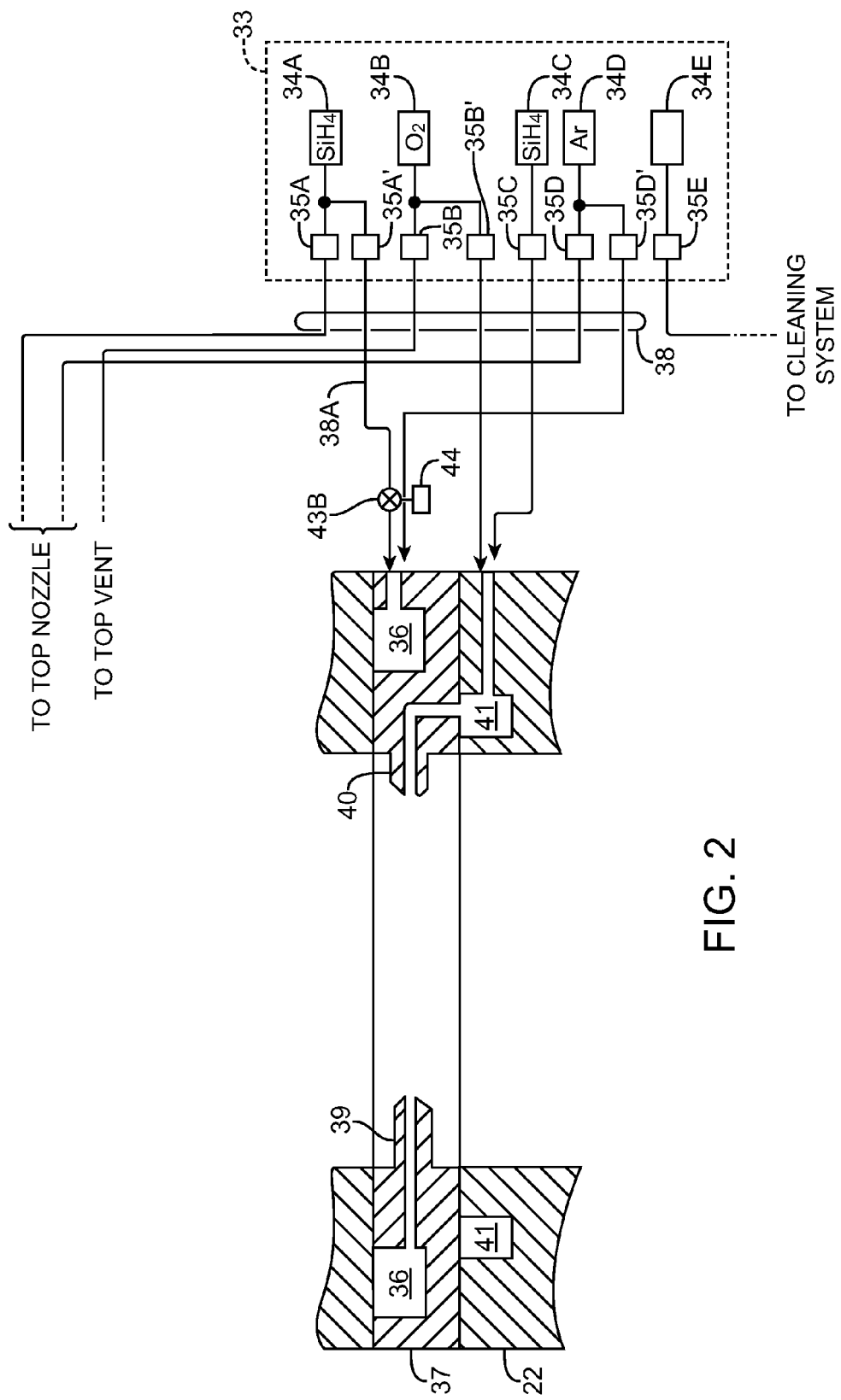
FIG. 2 is a simplified cross section of a gas ring that may be used in conjunction with the exemplary HDP-CVD system of FIG. 1.

A gas delivery system 33 provides gases from several sources, 34A-34F chamber for processing the substrate via gas delivery lines 38 (only some of which are shown). As would be understood by a person of skill in the art, the actual sources used for sources 34A-34F and the actual connection of delivery lines 38 to chamber 13 varies depending on the deposition and cleaning processes executed within chamber 13. Gases are introduced into chamber 13 through a gas ring 37 and/or a top nozzle 45. FIG. 2 is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of gas nozzles 39 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one embodiment, gas ring 37 has 24 gas nozzles 39 made from an aluminum oxide ceramic.

Gas ring 37 also has a plurality of gas nozzles 40 (only one of which is shown), which in a preferred embodiment are co-planar with and the same in length as source gas nozzles 39, and in one embodiment receive gas from body plenum 41. Gas nozzles 39 and 40 are not fluidly coupled in some embodiments where it is desirable not to mix gases before injecting the gases into chamber 13. In other embodiments, gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

In the embodiment shown in FIGS. 1 and 2, remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

Figure 3:
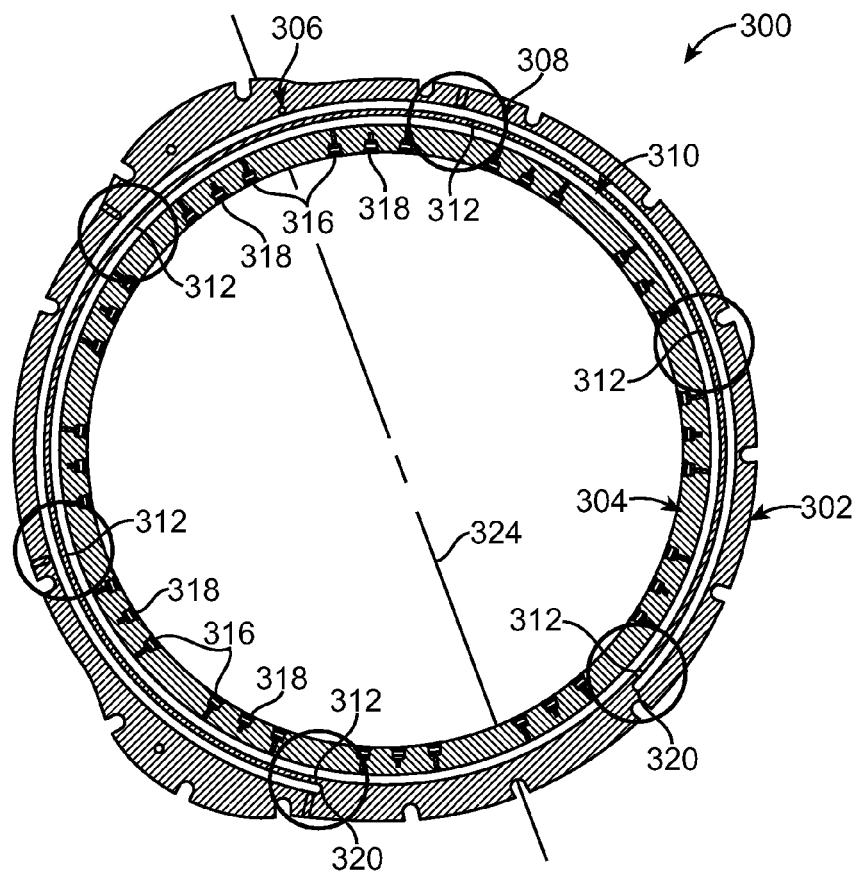
FIG. 3 is a cross-sectional view of a gas ring according to an embodiment of the present invention.

FIG. 3 shows a gas ring 300 according to one embodiment of the present invention. The gas ring 300 includes an outer surface or periphery 302 and an inner surface or periphery 304. A gas inlet 306 is disposed at the outer surface 302 of the gas ring 300, and is fluidicly coupled with a first channel or plenum 308. The first channel 308 is disposed between the outer surface 302 and the inner surface 304 of the gas ring 300. A second channel or plenum 310 is disposed between the outer surface 302 and the inner surface 304 of the gas ring 300, and is fluidicly coupled with the first channel 308 via a plurality of orifices or openings 312. As shown in FIG. 3, the first channel is an outer channel 308, and the second channel is an inner channel 310 which is disposed between the outer channel 308 and the inner surface 304 of the gas ring 300. In other embodiments, however, the first and second channels 308, 310 may be arranged differently. For instance, the two channels may be laterally spaced from one another along the axis of the gas ring 300 and have approximately the same circumference.

FIG. 3 shows six orifices 312 which are substantially uniformly spaced along a circumference of the first channel 308 or the second channel 310. A plurality of first gas outlets 316 are distributed over the inner surface 304 of the gas ring 300, and are fluidicly coupled with the second channel 310. FIG. 3 shows 24 first gas outlets 316. There are 12 second gas outlets 318 which are fluidicly isolated from the second channel 310 and configured to introduce gas into the process chamber from another gas source. For instance, the first gas outlets 316 may be used to introduce a silicon-source gas such as silane, and the second gas outlets 318 may be used to introduce another reaction gas such as oxygen.

In the specific embodiment shown, the second channel 310 extends 360° around the inner surface 304 of the gas ring 300, while the first channel 308 extends less than 360° partially around the inner surface 304 of the gas ring 300 with two first channel ends 320 spaced from one another. An orifice 312 is disposed near each of the two first channel ends 320, which are angularly spaced from one another by about 60° in the gas ring 300 that includes six uniformly spaced orifices 312, as shown in FIG. 3. The gas inlet 306 is coupled with the first channel 308 at a location which is approximately midway between the two first channel ends 320 in distance as measured along the first channel 308. In general, the plurality of orifices 312 comprise an even number of orifices 312 which is greater than two. The plurality of orifices 312 are substantially symmetrically disposed with respect to a line 324 passing through the gas inlet 306 and a center of a circumference of the first channel 308. None of the orifices 312 lie on the line passing through the gas inlet 306 and the center of the circumference of the first channel 308. Of course, in alternate embodiments, the number and spacing of the orifices 312 may vary.

The plurality of orifices 312 are spaced from the gas inlet 306 by a plurality of distances. The orifices 312 have different sizes to provide a substantially uniform gas distribution via the gas outlets 316 during a transient period when a gas is initially introduced into the gas ring 300. In general, the orifices 312 have sizes which vary with the distances from the gas inlet 306 as measured along the first channel 308, such that the size of the orifice 312 increases with an increase in the distance between the orifice 312 and the gas inlet 306 as measured along the first channel 308.

Figure 4:
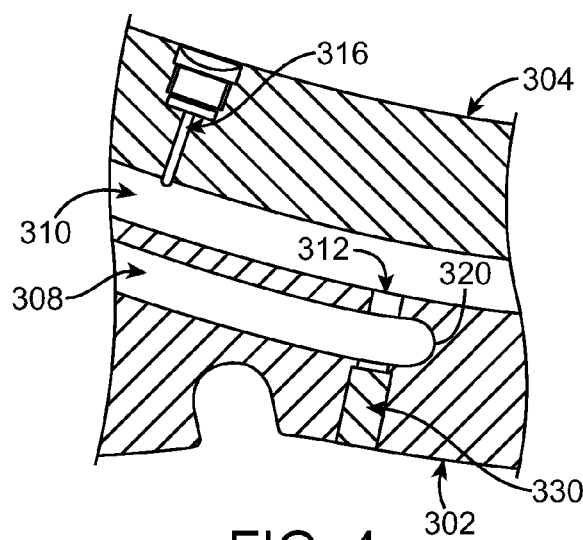
FIG. 4 is a close-up cross-sectional view of a portion of the gas ring of FIG. 3.

FIG. 4 shows a close-up view of the region near one of the first channel ends 320. One way to make an orifice 312 is by drilling a hole through the portion of the gas ring 300 from the outer surface 302 through the first channel 308 into the second channel 310. The hole between the outer surface 302 and the first channel 308 may then be closed by a plug 330.

Figure 5:
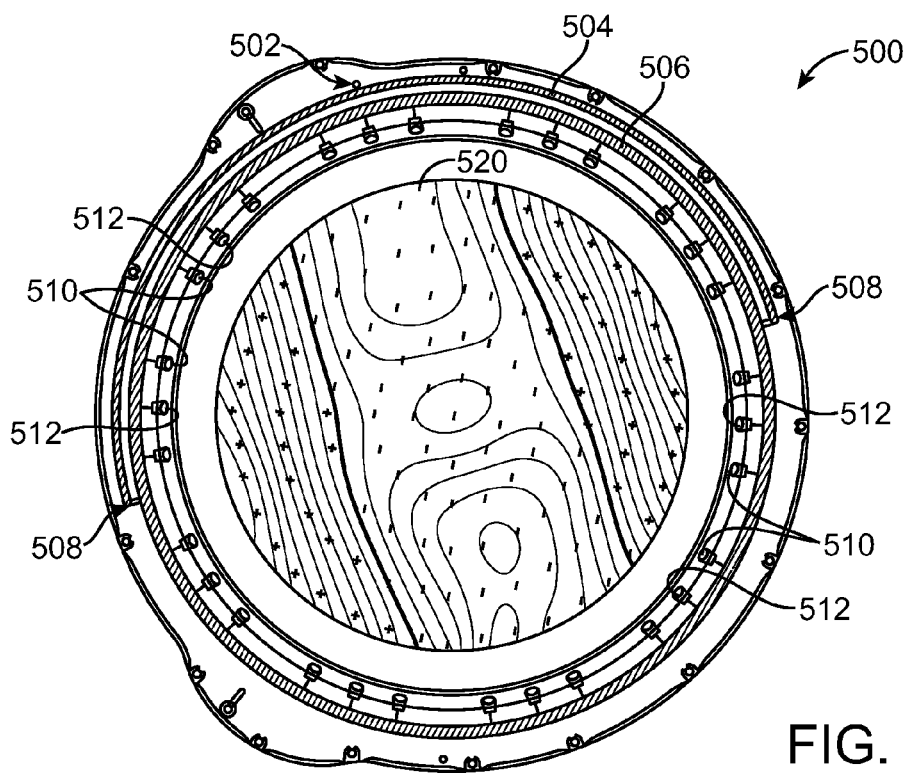
FIG. 5 is a view illustrating the thickness variation of a layer deposited on a substrate using a prior gas ring.
Figure 6:
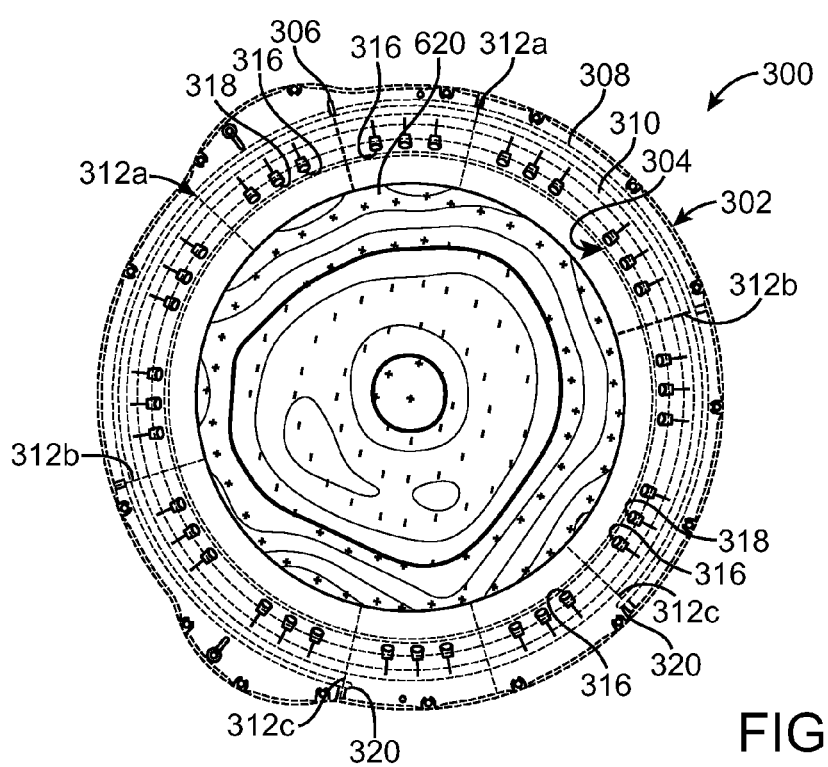
FIG. 6 is a view illustrating the thickness variation of a layer deposited on a substrate under the same conditions as for the layer in FIG. 5 and using a gas ring according to an embodiment of the present invention.

FIGS. 5 and 6 show experimental results of depositing liners or lining layers on substrates using a prior gas ring 500 and the gas ring 300 according to the exemplary embodiment of the present invention. In FIG. 5, the prior gas ring 500 includes a gas inlet 502 fluidicly coupled to the outer channel 504, which is fluidicly coupled to the inner channel 506 by two orifices 508 disposed 180° apart. There are 24 first gas outlets 510 fluidicly coupled to the inner channel 506, and 12 second gas outlets 512 fluidicly coupled to another gas source. The orifices 508 are about 0.188 inch in diameter. The gas ring 300 has six orifices 312, including two orifices 312a about 30° from the gas inlet 306, two orifices 312b about 90° from the gas inlet 306, and two orifices 312c about 150° from the gas inlet 306. The closest orifices 312a are about 0.093 inch in diameter, the intermediate orifices 312b are about 0.125 inch in diameter, and the farthest orifices 312c are about 0.221 inch in diameter.

The liners being deposited are silicon oxide liners formed by plasma-enhanced chemical vapor deposition using the HDP-CVD system 10. The process gas includes silane introduced through the first gas outlets 316 or 510 and $O_2$ introduce through the second gas outlets 318 or 512. The energy applied includes about 1500 W in the top coil 29 and about 5000 W in the side coil 30. The operating temperature is about 450° C. and the operating pressure is about 6 milli-torr. The substrates 520 and 620 are 300 mm in diameter. The deposition time is about 3 seconds.

The liner formed on the substrate 520 using the prior gas ring 500 has a thickness of about 241.8 Å with a variation of 8.10%. As shown in FIG. 5, the liner is thicker on the two sides which are closest to the two orifices 508. The liner formed on the substrate 620 using the gas ring 300 of the present invention has a thickness of about 216.5 Å with a variation of 3.62%, which is a significant 4.48% improvement. The thickness variation is reduced by more than half. As shown in FIG. 6, the liner thickness is more symmetrical with respect to the center of the substrate 620. The symmetry value of the liner is 2.66 (Å/Å) in FIG. 6 and is 4.2 in FIG. 5. A plurality of tests were conducted for different orifices sizes, and it was established that uniformity of the liner is improved by increasing the size of the orifice 312 with an increase in the distance between the orifice 312 and the gas inlet 306 as measured along the first channel 308. Test results further show that after the transient period, subsequent deposition under more steady state conditions continues to produce generally uniform layers using the gas ring 300 with the variable orifices 312.

It is to be understood that the above description is intended to be illustrative and not restrictive. Many embodiments will be apparent to those of skill in the art upon reviewing the above description. By way of example, the present invention may extend to other types of chambers and to other processes for processing substrates. The number, size, and arrangement of the variable orifices 312 may be modified and adapted to specific situations. The scope of the invention should, therefore, be determined not with reference to the above description, but instead should be determined with reference to the appended claims along with their full scope of equivalents.

What is claimed is:

1. A gas distribution system for providing a gas flow to a process chamber comprising:

a gas ring including an outer surface and an inner surface;

a gas inlet disposed at the outer surface of the gas ring, the gas inlet being fluidicly coupled with a first arcuate channel which is disposed between the outer surface and the inner surface of the gas ring;

a plurality of gas outlets distributed over the inner surface of the gas ring, the plurality of gas outlets being fluidicly coupled with a second arcuate channel which is disposed between the outer surface and the inner surface of the gas ring; and a plurality of holes extending from the first arcuate channel to the second arcuate channel to fluidicly couple the first arcuate channel to the second arcuate channel within the gas ring, the first arcuate channel being fluidicly coupled to the process chamber only through the second arcuate channel, the plurality of holes comprising a first hole and a second hole, the first hole having a first angle from the inlet and a first diameter, the second hole having a second angle from the inlet and a second diameter, the first hole extending from the first arcuate channel to the second arcuate channel with the first angle and the first diameter, the second hole extending from the first arcuate channel to the second arcuate channel with the second angle and the second diameter, wherein the first angle and the first diameter are less than the second angle and the second diameter to provide substantially uniform gas flow through the outlets;

wherein the first arcuate channel extends less than 360° partially around the inner surface of the gas ring with two first channel ends spaced from one another and the second arcuate channel extends 360° around the inner surface of the gas ring.

2. The gas distribution system of claim 1 wherein the plurality of holes are substantially uniformly spaced along a circumference of the first arcuate channel and wherein the plurality of holes comprises a third hole having a third angle and a third diameter, the third hole extending from the first arcuate channel to the second arcuate channel with the third angle and the third diameter, wherein the second angle and the second diameter are less than the third angle and the third diameter to provide a substantially uniform gas flow through the plurality of gas outlets.

3. The gas distribution system of claim 1 wherein the gas inlet is coupled with the first arcuate channel at a location which is approximately midway between the two first channel ends in distance as measured along the first arcuate channel, and wherein the plurality of holes comprise an even number of holes which is greater than two.

4. The gas distribution system of claim 3 wherein the plurality of holes are substantially symmetrically disposed with respect to a line passing through the gas inlet and a center of a circumference of the first arcuate channel.

5. The gas distribution system of claim 4 wherein six holes are distributed along the circumference of the first arcuate channel.

6. In an apparatus for processing a semiconductor substrate by flowing a process gas into a chamber and causing a reaction of the process gas in the chamber, a gas distribution system for directing a flow of the process gas into the chamber, the gas distribution system comprising:

a gas ring including an outer periphery and an inner periphery;

a gas inlet disposed at the outer periphery of the gas ring, the gas inlet being fluidicly coupled with a first arcuate channel which is disposed between the outer periphery and the inner periphery of the gas ring; and a plurality of gas outlets distributed over the inner periphery of the gas ring, the plurality of gas outlets being fluidicly coupled with a second arcuate channel which is disposed between the outer periphery and the inner periphery of the gas ring;

wherein the first arcuate channel is fluidicly coupled with the second arcuate channel at a plurality of locations via a plurality of holes extending from the first arcuate channel to the second arcuate channel within the gas ring, the first arcuate channel being fluidicly coupled to the chamber only through the second arcuate channel, the plurality of holes comprising a first hole and a second hole, the first hole extending from the first arcuate channel at a first location separated from the inlet along the first arcuate channel by a first angle, the second hole extending from the first arcuate channel at a second location separated from the inlet along the first arcuate channel by a second angle, the first hole having a first diameter and extending from the first arcuate channel to the second arcuate channel with the first angle and the first diameter, the second hole having a second diameter and extending from the first arcuate channel to the second arcuate channel with the second angle and the second diameter, wherein the first angle and the first diameter are less than the second angle and the second diameter to provide a substantially uniform gas distribution via the gas outlets during a transient period when a gas is initially introduced into the gas ring;

wherein the first arcuate channel extends less than 360° partially around the inner periphery of the gas ring with two first channel ends spaced from one another and the second arcuate channel extends 360° around the inner periphery of the gas ring.

7. The gas distribution system of claim 6 wherein a diameter of each of the plurality of holes varies with distance from the gas inlet as measured along the first arcuate channel, such that the diameter increases with an increase in the distance.

8. The gas distribution system of claim 6 wherein the plurality of holes are substantially symmetrically disposed with respect to a line passing through the gas inlet and a center of a circumference of the first arcuate channel.

9. The gas distribution system of claim 6 wherein the plurality of holes comprise an even number of holes which is greater than two, and wherein none of the holes lie on the line passing through the gas inlet and the center of the circumference of the first arcuate channel.

10. The gas distribution system of claim 6 wherein the plurality of holes are substantially uniformly spaced along a circumference of the first arcuate channel and wherein the plurality of holes comprises a third hole having a third hole diameter, the third hole extending from the first arcuate channel at a third location separated from the inlet along the first arcuate channel by a third angle and extending from the first arcuate channel to the second arcuate channel with the third hole diameter, wherein the second angle and the second diameter are less than the third angle and the third diameter to provide a substantially uniform gas flow through the plurality of gas outlets.

* * * * *